United States Patent [19]

Justice

[11] 3,979,238

[45] Sept. 7, 1976

[54] ETCHANT FOR SILICON NITRIDE AND BOROSILICATE GLASSES AND METHOD OF USING THE ETCHANT

[75] Inventor: Henry Wayne Justice, Washington, N.J.

[73] Assignee: RCA Corporation, New York, N.Y.

[22] Filed: May 14, 1975

[21] Appl. No.: 577,606

[52] U.S. Cl. .................................. 156/3; 156/15; 252/79.3; 252/79.4
[51] Int. Cl.$^2$ ............... C03C 15/00; C09K 13/08; C09K 13/06
[58] Field of Search ............ 156/8, 15, 17, 24; 65/30, 31; 252/79.3, 79.4; 134/3

[56] References Cited
UNITED STATES PATENTS

| | | |
|---|---|---|
| 3,642,549 | 2/1972 | Couture et al. ........................ 156/24 |
| 3,767,491 | 10/1973 | Chough ................................... 156/5 |
| 3,784,424 | 1/1974 | Chang .................................... 156/15 |
| 3,811,974 | 5/1974 | Squillace et al. ............... 252/79.3 X |

*Primary Examiner*—William A. Powell
*Attorney, Agent, or Firm*—Glenn H. Bruestle; Donald S. Cohen

[57] ABSTRACT

Superimposed layers of silicon nitride and borosilicate glasses are etched with a mixture of phosphoric acid, fluoboric acid and glycerine at a temperature of between 100°C and 110°C. The etchang does not adversely affect photoresists so that the etchant can be used to etch through regions of the superimposed layers defined by a photoresist masking layer.

10 Claims, 2 Drawing Figures

ETCHANT FOR SILICON NITRIDE AND BOROSILICATE GLASSES AND METHOD OF USING THE ETCHANT

BACKGROUND OF THE INVENTION

The present invention relates to an etchant for etching silicon nitride and borosilicate glasses, and a method of etching through superimposed layers of silicon nitride and borosilicate glasses.

In making semiconductor devices it is the practice to passivate or protect the surface of a body of semiconductor material with a layer or superimposed layers of inorganic insulating materials. The materials generally used for this purpose include silicon dioxide, silicon nitride and borosilicate glasses. One type of protection system used includes a layer of a borosilicate glass over a layer of silicon nitride. Also, a layer of silicon dioxide is often used between the silicon nitride layer and the semiconductor body.

It is often desirable to provide openings through the protection layer or layers to the semiconductor body. Such openings are usually formed by applying a photoresist mask on the outermost layer of the protection system with the mask having openings therethrough where the openings in the protection system are desired. The uncoated regions of the protection system are then removed with a suitable etchant. Where the protection system comprises superimposed layers of different materials, it is desirable to use an etchant which will remove the materials of all of the layers so as to simplify the etching operation. Also, it is desirable that, although the etchant readily attacks the materials of the protection system, the etchant should not attack the photoresist.

Various etchants have been developed for etching silicon nitride and silicon oxide. For example, U.S. Pat. No. 3,859,222, issued Jan. 7, 1975 to A. S. Squillace et al, entitled "Silicon Nitride-Silicon Oxide Etchant" discloses an etchant consisting of a mixture of phosphoric acid and a fluoborate anion for etching silicon nitride and silicon oxide. However, the etchants for silicon nitride, including that of U.S. Pat. No. 3,859,222, do not also etch borosilicate glasses.

SUMMARY OF THE INVENTION

An etchant which readily attacks silicon nitride and borosilicate glasses is a mixture of 75 to 25% by volume of phosphoric acid and 25 to 75% by volume of glycerine with the addition of fluoboric acid in the amount of 1 to 6% by volume of the mixture of phosphoric acid and glycerine.

DETAILED DESCRIPTION OF THE INVENTION

I have found that both silicon nitride and borosilicate glasses can be etched by an etchant consisting essentially of phosphoric acid, glycerine and flouboric acid. More particularly, the etchant is a mixture of 75 to 25% by volume of the phosphoric acid and 25 to 75% by volume of the glycerine with the fluoboric acid being present in the amount of 1 to 6% by volume of the mixture of the phosphoric acid and the glycerine. Preferably the etchant includes a mixture of 75% by volume of the phosphoric acid, 25% by volume of the glycerine and 1 to 2% by volume of the mixture of the fluoboric acid.

Figure 1:
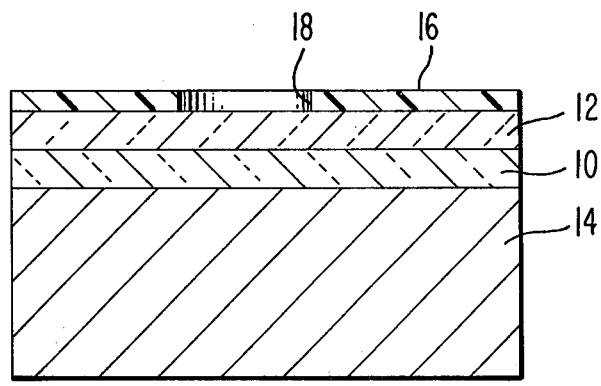
FIGS. 1 and 2 are sectional views of a semiconductor device illustrating the steps of the method of the present invention of using the etchant of the present invention.
Figure 2:
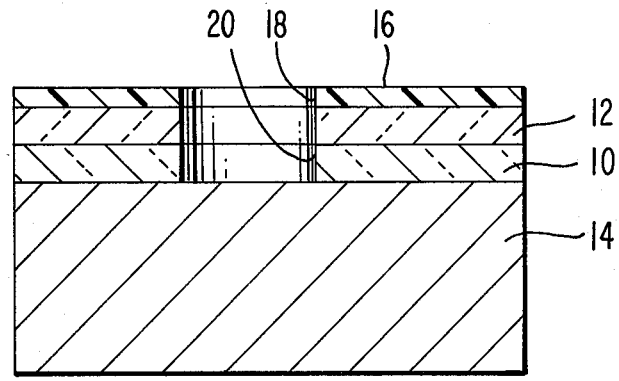

The etchant of the present invention can be used to etch through superimposed layers 10 and 12 of silicon nitride and a borosilicate glass on a body 14 (see FIG. 1). The body 14 may be of a single crystalline semiconductor material, such as silicon, used for making a semiconductor device. In semiconductor devices the borosilicate glass layer 12 generally overlies the silicon nitride layer 10. However, the etchant of the present invention can be used to etch the layers where the silicon nitride layer overlies the borosilicate glass layer. To etch a hole through the borosilicate glass layer 12 and the silicon nitride layer 10 to the surface of the body 14, a photoresist masking layer 16 having an opening 18 therethrough is applied to the surface of the borosilicate glass layer 12 using standard photolithographic techniques. The exposed surface of the borosilicate glass layer 12 is then brought into contact with the etchant which is heated to a temperature of between 100°C and 110°C, such as by immersing the coated body in the etchant. The etchant will attack first the borosilicate glass and then the silicon nitride to etch a hole 20 through the layers as shown in FIG. 2. However, the etchant does not readily attack the photoresist so that the masking layer 16 will remain on the borosilicate glass layer during the etching operation. For many types of semiconductor devices a layer of silicon dioxide is provide between the silicon nitride layer 10 and the semiconductor body 14. The etchant of the present invention will also etch through such a silicon dioxide layer.

The etchant of the present invention etches through borosilicate glass faster than it etches through silicon nitride, generally about 5 to 10 times faster. Also, the etching rate of the etchant varies with the ratio of the ingredients of the etchant. For any particular ratio of the phosphoric acid to the glycerine, increasing the amount of the fluoboric acid generally increases the etching rate for both the borosilicate glass and the silicon nitride. Also, the higher percentage of the phosphoric acid in the etchant generally provides a faster etching rate. Thus, an etchant containing 75% by volume of phosphoric acid and 25% by volume of glycerine is preferred. Although the higher amounts of fluoboric acid increases the etching rate of the borosilicate glass and the silicon nitride, it also increases the problem of undercutting the photoresist. Therefore, the etchant which is a mixture of 75% by volume of phosphoric acid and 25% by volume of glycerine with fluoboric acid in the amount of 1 to 2% by volume of the mixture of the phosphoric acid and the glycerine is preferred to achieve a relatively high rate of etching with a minimum of undercutting. Also, it is preferable to carry out the etching operation with the etchant being at a temperature of 102°C to 105°C since at this temperature the adhesion of the photoresist is least effected.

I claim:

1. An etchant consisting essentially of a mixture of 75 to 25% by volume of phosphoric acid, 25 to 75% by volume of glycerine and fluoboric acid in the amount of 1 to 6% by volume of the mixture of phsophoric acid and glycerine.

2. An etchant in accordance with claim 1 which includes 75% by volume of the phosphoric acid and 25% by volume of the glycerine.

3. An etchant in accordance with claim 2 in which the fluoboric acid is present in the amount of 1 to 2% by volume of the mixture of phosphoric acid and glycerine.

4. A method of etching silicon nitride and borosilicate glasses comprising contacting said materials with an etchant consisting essentially of 75 to 25% by volume of phosphoric acid, 25 to 75% by volume of glycerine and fluoboric acid in the amount of 1 to 6% by volume of the mixture of phosphoric acid and glycerine.

5. The method in accordance with claim 4 in which the etchant is at a temperature of 100°C to 110°C.

6. The method in accordance with claim 5 in which the silicon nitride and the borosilicate glass are in the form of superimposed layers on a body, the etchant is first brought into contact with at least a portion of the outermost layer until the portion of the outermost layer is etched away and is then brought into contact with at least a portion of the innermost layer to etch the innermost layer.

7. The method in accordance with claim 6 in which a photoresist masking layer is provided on the outermost layer with the masking layer having an opening therethrough to expose a portion of the outermost layer and the etchant is first brought into contact with the exposed portion of the outermost layer until an opening is etched through the outermost layer to the innermost layer, and then the etchant is brought into contact with the innermost layer to etch the innermost layer.

8. The method in accordance with claim 7 in which the etchant is at a temperature of 102°C to 105°C.

9. The method in accordance with claim 7 in which the etchant includes 75% by volume of the phosphoric acid and 25% by volume of the glycerine.

10. The method in accordance with claim 9 in which the fluoboric acid is present in the etchant in the amount of 1 to 2% by volume of the mixture of the phosphoric acid and the glycerine.

* * * * *